United States Patent [19]

Langdon, Jr.

[11] Patent Number: 4,749,983

[45] Date of Patent: Jun. 7, 1988

[54] COMPRESSION OF MULTILEVEL SIGNALS

[75] Inventor: Glen G. Langdon, Jr., San Jose, Calif.

[73] Assignee: International Business Machines Corporation, Armonk, N.Y.

[21] Appl. No.: 857,694

[22] Filed: Apr. 29, 1986

[51] Int. Cl.$^4$ .............................................. H03M 7/30
[52] U.S. Cl. ............................................. 340/347 DD
[58] Field of Search ................ 340/347 DD; 358/133, 358/135, 138, 260, 261

[56] References Cited

U.S. PATENT DOCUMENTS 4,467,317  8/1984  Langdon, Jr. et al. ............. 340/347

OTHER PUBLICATIONS

"Compression of Black-White Images with Arithmetic Coding" by Rissanen and Langdon, IEEE Transactions on Communications, vol. COM-29, No. 6, Jun. 1981.
"Parameter Reduction and Context Selection for Compression of Gray-scale Images", by Todd et al., IBM J. Res. Develop., vol. 29, No. 2, Mar. 1985.
"Computer Design", by Langdon, Computeach Press, San Jose, California, 1982, pp. 489–491.
"An Introduction to Arithmetic Coding", IBM Journal of Research and Development, by Langdon, vol. 28, No. 2, pp. 135–149.

Primary Examiner—William M. Shoop, Jr.
Assistant Examiner—Richard K. Blum
Attorney, Agent, or Firm—Simon K. Lee

[57] ABSTRACT

This invention relates to method and apparatus for compressing multilevel signals. The compression is based upon prediction errors and probability distributions. Compression is improved by conditioning the probability distributions using context of previous events. Storage required for storing the probability distributions is reduced by partitioning the prediction errors into predetermined ranges which become the coding events and contexts. Compression is made efficient with a partition which is a function of the sign and the number of significant bits in the prediction errors.

8 Claims, 5 Drawing Sheets

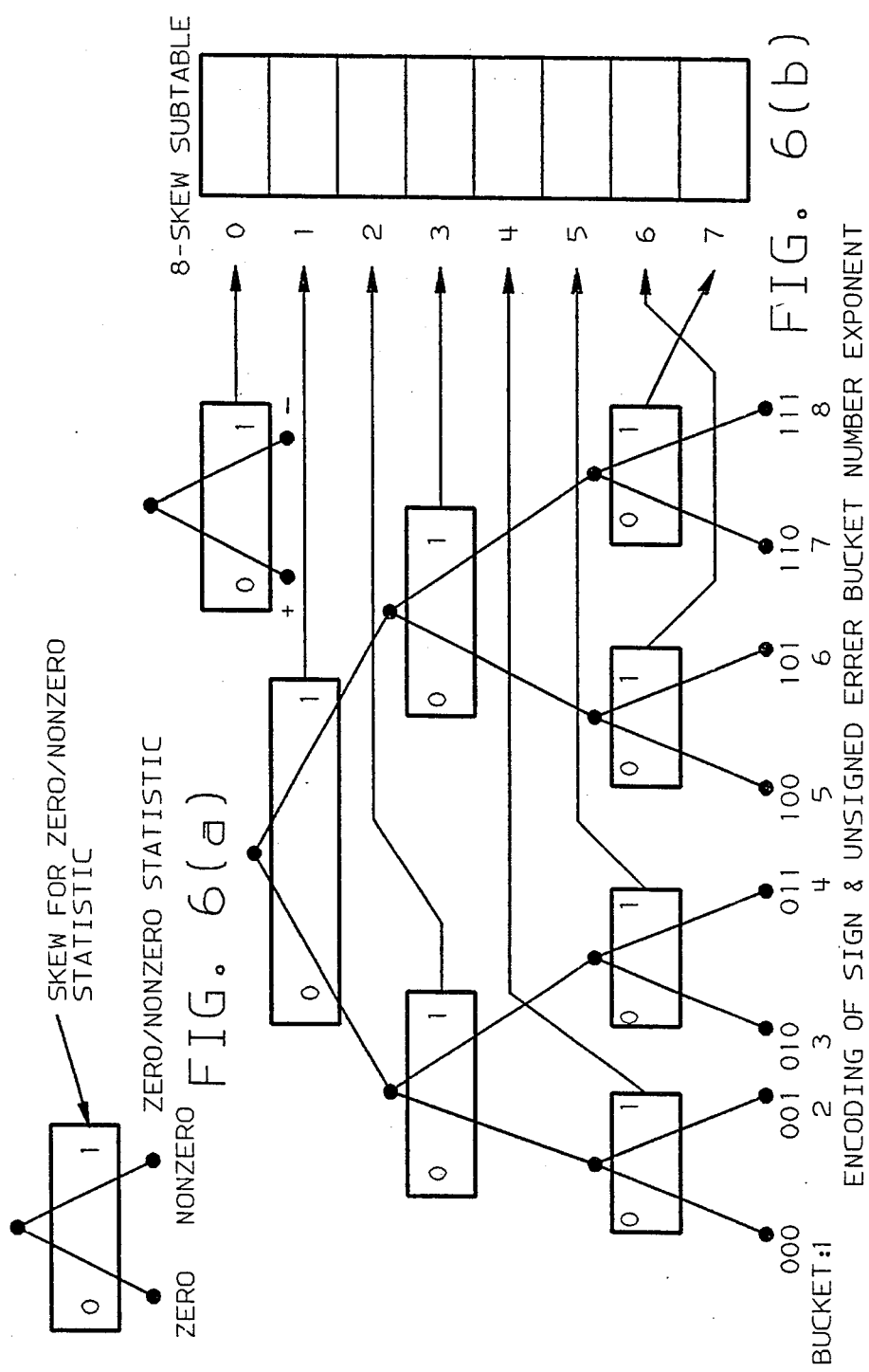

COMPRESSION OF MULTILEVEL SIGNALS

FIELD OF THE INVENTION

This invention relates to data compression. More particularly, it relates to the encoding/decoding and compression/decompression of multilevel signals from such sources as digitized gray-scale pictures.

BACKGROUND OF THE INVENTION

Data compression generally refers to the encoding of information for reducing the number of symbols required to identify the information and thereby achieving an economy on storage and time needed to transmit the information.

In lossless data compression, the original information is fully recoverable from the compressed data. Full recovery is important for information such as pictures from medical radiology or satellites where it is difficult, if not impossible, to retake the pictures, but where the original resolution of the pictures are needed for future analysis and processing.

Rissanen and Langdon, "Compression of Black-White Images with Arithmetic Coding", IEEE Transactions on Communications, Vol. COM-29, No. 6, June 1981, disclose a method of losslessly compressing black-white pictures (i.e. information consisting of bilevel signals). The method separates a compression system into a modeling unit and a coding unit. In the modeling unit, a set of statistical characteristics of the information is selected as events for which relative probabilities are gathered. The information is encoded based upon the relative probabilities.

To improve compression, Rissanen and Langdon further disclose conditioning the probabilities using contexts of prior events.

The idea of conditioning can be illustrated by considering a card game in which the card deck is drawn without replacement. As the cards in the deck are drawn, the odds are changed according to the probabilities of the events conditioned to a state defined by the previously drawn cards.

Conditioning can also be illustrated by considering the modeling unit as a finite state machine which is described by the following equations:

$$x(t+1) = F(x(t), s(t+1))$$

$$z(t) = G(x(t))$$

where s(t) denotes the $t^{th}$ symbol in the string $s = s(1)$ $s(2) \ldots$ to be modeled and encoded;

x(t) denotes an intermediate value, or the internal state of finite state machine;

z(t) is one of the K contexts, or conditioning classes, each of which is defined by the states of a set of prior events.

The probability distribution P(y/Z) over a symbol y at each class Z gives the conditional probability that symbol s(t+1) equals y, given that the associated class z(t) is Z.

In the aforementioned method of compressing black and white pictures, the number K of contexts z(t) is equal to $2^n$, where n is the number of prior events selected to define a context. Because each signal has 2 values, each context has 2 coding probabilities. In general, if each symbol s(t) has L values and if n prior symbols are selected to define each context z(t), there results in $L^n$ contexts with each context having a distribution of L probabilities.

Todd et al., "Parameter Reduction and Context Selection for Compression of Gray-scale Images", IBM J. Res. Develop., Vol. 29, No. 2, March 1985, disclose a method for losslessly compressing multilevel signals. The event selected therein is prediction error, defined as the difference between a predicted value of a current pel (picture element) and the actual value. Compression is improved by using independent probability distributions each of which is conditioned by context of a subset of neighboring pels. The improvement is attained because most images are usually formed by contrasts between "smooth regions" and "edges". Since the probability for predicting a pel value in a "smooth region" is different from that in an "edge", compression is thus improved when probabilities are conditioned by neighboring pels.

For a gray scale image having L-level signals, the values of prediction errors lie between $-L$ and $+L$. If the aforementioned method for compressing black and white pictures is straightly applied, the number of probabilities that must be stored and/or transmitted to the decoding unit becomes impractically large. Therefore, Todd et al. further disclose combining prediction errors into ranges, or error buckets, and conditioning such probability distributions by contexts of selected sets of neighboring pel error buckets.

It should be noted from experience that the frequencies of prediction errors roughly approximate a distribution as shown in FIG. 5. Because a greater portion of most pictures usually falls under the "smooth" region, it is expected that the difference in intensity between a pel and its neighbors, hence the prediction error, is usually small.

In general, the efficiency of a compression system depends on the accuracy of the relative probabilities which describe the events. Partitioning prediction errors into buckets would necessarily compromise accuracy of the probability distribution and would, in turn, cause a degradation of the compression efficiency. To minimize the degradation, only a small number of prediction errors should be put into a bucket when the frequencies of such prediction errors are high. On the other hand, for less frequent prediction errors, the effect on compression efficiency would remain small even if more such errors are put into a bucket. By partitioning all prediction errors into predetermined buckets of equal size, Todd et al. therefore fail to minimize the degradation due to partitioning. In the case where the bucket sizes are optimized, the method according to Todd et al. suffers a loss in speed because it needs a first pass to determine the bucket ranges before a second pass can be performed for encoding the data.

According to the above-mentioned compression method by Todd et al., encoding a signal requires a determination of the bucket in which a prediction error belongs. Such determination may be performed, for example, by locating, through a table look-up process on the error value, a bucket number. The bucket number is then used in conjunction with the appropriate context to locate an appropriate codeword or coding parameter based on the probability distribution. For images having, say, 12-bit pels, the table look-up process involves a table of 8K words (twelve bits for the magnitude of a prediction error together with and one sign bit). In some data compression applications (e.g. satellite pictures), there is a transmission time and/or response time requirement the fulfillment of which would be impeded by such table look-up process. Thus, there is a need for a method of compressing multilevel data wherein the steps required to code a signal can be minimized without significant compression loss.

SUMMARY OF THE INVENTION

This invention facilitates the compression of multilevel signals by having the sizes of the error buckets varied according to the frequencies of the prediction errors contained therein without requiring extra passes. It also eliminates the need of the aforementioned table look-up process for locating a bucket. The method comprises the steps in response to each signal of: predicting the value of the signal; calculating the prediction error as the difference between said predicted value and the actual value; converting the prediction error into an exponent part and a mantissa part; encoding the exponent part statistically, using a context of previous prediction errors; and combining said encoding of the exponent part with an encoding of the mantissa part.

BRIEF DESCRIPTION OF THE DRAWINGS

FIG. 6(a) illustrates the storing of statistics for a zero/nonzero prediction error.

FIG. 6(b) illustrates the storing of statistics for the sign and the unsigned exponent part of prediction errors by means of deblocking.

DESCRIPTION OF THE PREFERRED EMBODIMENT

A. ENCODING

Figure 1:
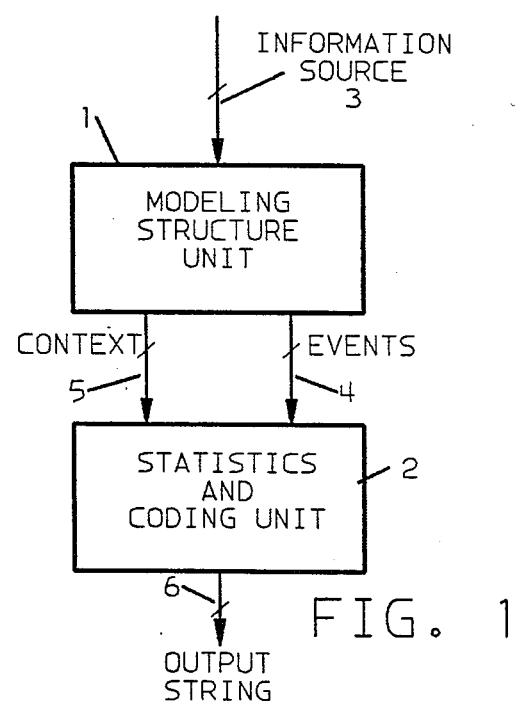
FIG. 1 is a block diagram of a compression system which consists of a modeling unit and a coding unit.

FIG. 1 illustrates a data compression system which embodies this invention. It consists of a modeling structure unit 1 and a statistics and coding unit 2. Signals 3 from an information source (not shown) such as a digitized gray-scale picture are fed to the modeling structure unit 1 in which they are converted to one or more events 4 and context 5. The events 4 and the context 5 are then fed to statistics and coding unit 2 in which the one (or more) event(s) is (are) encoded into code string 6 based upon the conditional probability of the event(s) in the given context.

Figure 2:
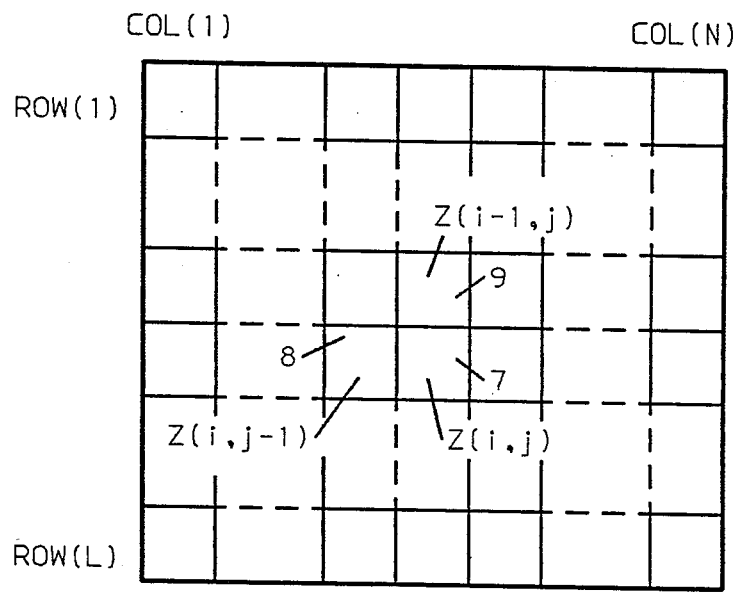
FIG. 2 is a portion of the picture which is the information to be compressed.
Figure 5:
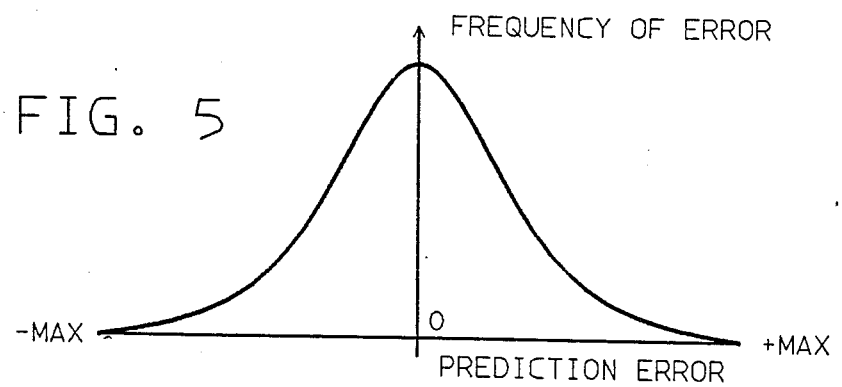
FIG. 5 illustrates a rough distribution of frequencies of prediction errors of an image.

FIG. 2 shows a portion of a digitized gray-scale picture which is to be compressed by the compression system of FIG. 1 and from which signals 3 are generated. The gray-scale picture is digitized into L rows x N columns of pels. Each pel of the picture becomes an element of a two dimensional (LxN) array wherein each element is a n-bit signal describing the intensity level (pel values) of a digitized point of the picture. When the picture is scanned row by row (raster-scan order), starting at the uppermost row and progressing from left to right, the two-dimensional array is converted to time sequential signals such that if $z(t)$ represents the value of the currently scanned pel $z(i,j)$ 7, then $z(t-1)$ represents the previous pel value $z(i,j-1)$ 8 and $z(t-N)$ represents the value of the pel $z(i-1,j)$ 9 immediately above $z(i,j)$ 7.

In the aforementioned gray-scale compression method by Todd et al., it is disclosed that data compression can be achieved by using prediction errors as coding events. It is also disclosed that prediction errors can be generated using one of the the following predictors :
P:$e(t)=z(t)-z(t-1)-[z(t-M+1)-z(t-M-1)]/2$ ;
P$_0$:$e(t)=z(t)$;
P$_h$ $e:(t)=z(t)-z(t-1)$;
P$_v$ $e:(t)=z(t)-z(t-M)$, etc.

Figure 3:
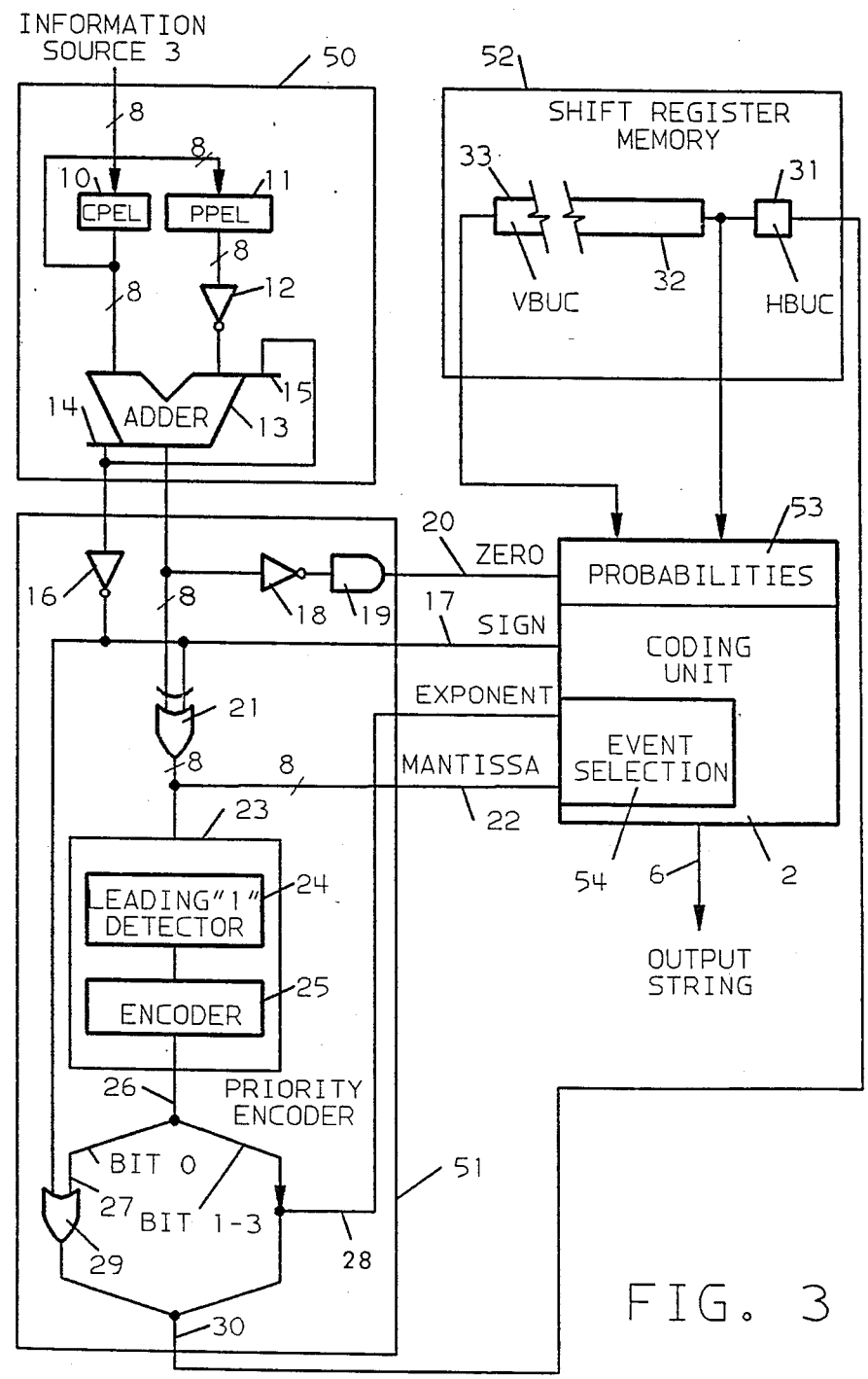
FIG. 3 illustrates the structure of the modeling unit of a preferred embodiment of the invention.

In this embodiment, the horizontal predictor P$_h$ is chosen. A prediction error is obtained by:

prediction error = pel value of new pel − predicted value
= pel value of new pel − pel value of previous pel FIG. 3 illustrates the structure of the compression system. It consists of a module 50 for generating prediction errors, a module 51 for generating events and context, a module 52 for generating context components, and a coding unit 2 which consists of means for the code itself plus a statistics means 53 for storing the coding parameters (arithmetic coding) or codewords.

Module 50 for generating prediction errors comprises of a register CPEL 10 which holds the current pel value and a register PPEL 11 which holds the previous pel value. Since the predicted value of a horizontal predictor is the previous pel value, therefore PPEL 11 is actually the predicted pel value. Inverters 12 and adder 13 are used in combination to generate a difference between the previous pel value and the current pel value which, in this embodiment, is actually the prediction error.

Module 51 partitions the prediction errors from module 50 into events ZERO 20, SIGN 17, EXPONENT, 28 MANTISSA 22 which are to be encoded and context input 30.

Module 52 receives context input 30 from module 51 and generates context components VBUC 33 and HBUC 31 which will be used for locating the appropriate coding parameter or codeword for coding each pel.

The encoding of the events ZERO 20, SIGN 17, EXPONENT 28, MANTISSA 22 is performed in coding unit 2. Coding unit 2 consists of means for storing codewords or coding parameters for each event, depending on context components VBUC 33 and HBUC 31. The statistics and coding unit possesses means to encode events ZERO 20, SIGN 17, EXPONENT 28 and MANTISSA 22 using the appropriate coding parameters or codewords. Any one of several coding means can be used, including adaptive or nonadaptive arithmetic coding or use of a Huffman codeword for each event value under its context.

The operation of the compression system can be illustrated by considering a signal coming from the information source 3. The signal is first stored in register CPEL 10. When the next sequential signal arrives, the previous signal is saved in register PPEL 11. Thus, at any time t, register CPEL 10 contains the current pel value $z(t)$ while register PPEL 11 contains value $z(t-1)$ of the previous pel which also represents the predicted pel value.

To calculate the prediction error (i.e. the difference between the current pel value $z(t)$ and the previous pel value $z(t-1)$), the content of register PPEL 11 is first inverted by inverters 12. The output of inverters 12 is then fed into one side of the adder 13 while the output of register CPEL 10 is fed into the other side. Adder 13 adds CPEL and the ones complement of PPEL. The high-order carry output C/OUT 14 of adder 13 is input back to its lowest order carry-in input 15, thereby forming the ones complement arithmetic of:

CPEL−PPEL=prediction error

High-order carry output C/OUT 14 of adder 13 is also inverted by inverter 16 to form the sign of the prediction error SIGN 17.

The n-bit output of adder 13 is inverted by inverters 18, the output of which is ANDed by AND gates 19 to form signal ZERO 20. ZERO 20 is true only if the n output bits of adder 13 are all 0's. Thus ZERO 20 is a signal which indicates a condition of zero prediction error.

To convert the output of adder 13 to an absolute value, each bit of the output of adder 13 is exclusively ORed with SIGN 17 using exclusive-OR gates 21. If the SIGN 17 is negative, exclusive-OR gates 21 would invert each bit of the adder output, whereas if SIGN 17 is positive the adder output would pass through the exclusive-OR gates unchanged. The n-bit output MANTISSA 22 of the exclusive-OR gates 21, is therefore the absolute value of the prediction error. This value, if left shifted by the appropriate amount, is a scaled mantissa.

MANTISSA 22 is fed into a priority encoder 23. A description of priority encoder 23 is found in Langdon, "Computer Design", Computeach Press, San Jose Calif., 1982 pp. 489-491. The priority encoder 23 consists of a 'leading one' detector circuit 24 which puts a '1' in the position of the leading 1 and a '0' in all other bit positions, and an encoder 25 where the output of the 'leading one' detector circuit 24 is encoded into a four-bit number 26.

Bits 1-3 of the output from the priority encoder 23 form signal EXPONENT 28. As illustrated in table 1, EXPONENT 28 has one of eight possible values depending on the value of a prediction error:

TABLE 1 partitioning of MANTISSA 22

| Absolute error value | GROUP | $2^n$(binary) | bits of MANTISSA to be encoded (indicated by x) |
|---|---|---|---|
| 0 | 0 | | do not apply |
| 1 | 1 | n=0(000) | none |
| 2,3 | 2 | n=1(001) | xxx |
| 4,5,...,7 | 3 | n=2(010) | xxxx |
| 8,9,...,15 | 4 | n=3(011) | xxxxx |
| 16,17,...,31 | 5 | n=4(100) | xxxxx |
| 32,33,...,63 | 6 | n=5(101) | xxxxxx |
| 64,65...,127 | 7 | n=6(110) | xxxxxxx |
| 128,129,..., $2^N-1$ | 8 | n=7(111) | xxxxxxxxxxx (N bits) |

It can be seen from Table 1 that the priority encoder is actually used ot determine an exponent of the prediction error with a base of two.

Table 1 also shows that prediction errors having an exponent values greater than seven are grouped into a single bucket which contains predeiction errors having an exponent value of seven.

EXPONENT 28 is combined with the sign bit SIGN 17 to form a bucket number which is used as a context component for conditioning the coding probabilities. The addition of a sign to the eight possible values of EXPONENT 28 gives 17 error buckets, i.e. −8, −7, ... −1, 0, +1, ... +7, +8. In order to be able to use these buckets later as a context component, a four-bit bucket number is used. To reduce 17 buckets to 16, buckets −8 and +8 are combined into a single four-bit binary number 1000. This is performed by ORing bit 0 27 of the output 26 of the priority encoder 28 with signal SIGN 17 at OR gate 29.

In summary, when used as context components 31 and 33, the prediction errors are grouped into:
1. buckets −7 through +7, each of which is represented by a sign bit and three address bits. (e.g. −7 is binary 1111, 0 is binary 0000, +7 is 0111 etc); and
2. a special bucket 1000 which contains those prediction errors that are less than −128 and those that are greater than +128.

Bucket number 30 is used to form context components for the conditional probability distribution of signal z(t). In this embodiment of the invention, the error buckets from the vertical pel 9 and the previous pel 8 are used as context components. Bucket number 30 is stored in register HBUC 31. The output of HBUC 31 is input into the coding unit 2 as one context component for coding z(t). At the same time, the content of HBUC 31 is stored in a shift register memory 32 with N elements. The output 33 of shift register memory 32, which is the error bucket of the pel vertically above the current pel, is another context component for coding z(t).

Coding unit 2 receives the description of prediction errors, as values of events ZERO, SIGN, MANTISSA, and EXPONENT. The encoding of a prediction error in coding unit 2 is performed on the basis of coding parameters (which reflect statistics) as determined for context components HBUC and VBUC.

Table 2 illustrates the steps of the coding unit 2. In encoding a prediction error of a pel, the first step is to check whether the ZERO is true (1.2). If ZERO is true (i.e. the prediction error for the pel is zero), then ZERO=true is encoded as event 1 (1.3) and the next pel is processed.

If the prediction error is not zero, ZERO=false is encoded as event 1. The sign of the prediction error SIGN; the error bucket number EXPONENT (i.e. position of the leading "1" bit); and the absolute value of the error following the leading "1" bit, [MANTISSA]$_{EXPONENT-1}$ are all encoded respectively as events 2, 3, and 4 (1.5 to 1.9). (Exception - when EXPONENT is equal to one, MANTISSA would equal to zero and event 4 is not encoded (1.8)).

TABLE 2

| Encoder steps | |
|---|---|
| 1.1 | Do until last pel |
| 1.2 | if (ZERO = true) then |
| 1.3 | encode (EVENT 1 = true) |
| 1.4 | else |
| 1.5 | encode (EVENT 1 = false) |
| 1.6 | encode (EVENT 2 = SIGN) |
| 1.7 | encode (EVENT 3 = EXPONENT) |
| 1.8 | if (EXPONENT ne 1) then |
| 1.9 | encode (EVENT 4 = [MANTISSA]$_{EXPONENT-1}$) |
| 1.10 | endif |
| 1.11 | endif |
| 1.12 | enddo |

When encoding the events, components HBUC and VBUC are used to address the statistics for the context. Event EXPONENT is encoded according to the tree shown in FIG. 6(b) where the value of EXPONENT is deblocked into entries of an 8-skew subtable. The method of deblocking an event is described by Langdon et al. in "Deblocking Method For Use With An Adaptive Arithmetic Encoder/Decoder", IBM Technical Disclosure Bulletin, Vol. 23, n. 6, November 1980 pp. 2528.

The events can be encoded using one of the many prior art encoding methods. As an example, an encoding procedure is herein described for encoding a prediction error of −2. The encoding uses the coder disclosed in U.S. Pat. No. 4,467,317, issued Aug. 21, 1984 to Langdon et al. and entitled "High-speed Arithmetic Compression using Concurrent Value Updating". Additional descriptions of the art of binary arithmetic coding is found in Langdon, "An introduction to Arithmetic Coding". IBM Journal of Research and Development, Vol. 28, n. 2, pp. 135-149.

Let "0" represent a condition of no prediction error (prediction error=0) and "1" represent a nonzero prediction error. Let the statistics tables for the binary coder have the following entries:

TABLE 3

| Binary Events | Statistics table | |
|---|---|---|
| | MPS | SKEW (K) |
| Zero/nonzero | "1" | 3 |
| Nonzero error table | | |
| 000 (sign) | "1" | 1 |
| 001 | "0" | 3 |
| 010 | "1" | 2 |
| 011 | "0" | 2 |
| 100 | "1" | 2 |
| 101 | "0" | 1 |
| 110 | "1" | 1 |
| 111 | "0" | 2 |

The first event to be encode is a zero/nonzero condition. With a prediction error of −2, the outcome to be encoded is a "nonzero", or a value "1". As shown is Table 3, this value is the MPS, so a skew of 3 is used. Referring now to FIG. 2 of the above mentioned U.S. Pat. No. 4,467,317 and the description thereof, a binary value of 0.001 (2**−3) is subtracted from register T and 0.001 is added to register C.

As the prediction error is nonzero, the second event that needs to be encoded is SIGN 17, which is the sign of the error bucket. The statistic for the sign is stored in location 000 as shown in Table 3 above. Let "1" represent a negative sign. From Table 3, it can be seen that a K of 1 must be encoded. Thus 0.1 is subtracted from register T and 0.1 is added to C.

The third event to be encoded is the bucket number for the value 2 of the prediction error. According to Table 1, the representation for the bucket is 001, so the third event is to encode a leading bit which is a 0. As illustrated in Table 3, the table address for the third event is always 001. The statistic shows that 0 is more probable and has a K of 3. Thus the third event outcome 0 is encoded by subtracting 0.001 from register T and adding 0.001 to register C.

The fourth event is to encode the second bit of the representation of 001 which is a 0. According to FIG. 6(b) and Table 3, the address for the statistic in the table is 010. The address is determined by shifting left the previous address and adding the value of the previous outcome. (Had the third event been 1, the fourth event address would have been 011.) At table location 010, the MPS is "1" and K is 2. Since the outcome is 0 instead of 1, the outcome type is NOT MPS. Thus the fourth event outcome is encoded by shifting register C left K=2 places and assigning 1.0 to register T.

The fifth event is to encode the final bit, which has the value of 1, of the 3-bit binary representation 001 of bucket value 2. The address of the fifth event, when the first two bits of the representation is 00, is 100. Table 3 shows that value 1 is the MPS and K is 2. Therefore the outcome is MPS and so 0.01 is subtracted from register T and 0.01 is added to register C. The new value of register T is 0.110, so a normalization shift of one bit makes it 1.110. Register C must also be shifted left one bit position. This completes the encoding of the exponent part of the prediction error.

Since the floating point representation describes an integer value, knowledge of the exponent determines the number of significant mantissa bits to be encoded. Also at this point, the most significant 1-bit of the the unscaled mantissa need not be encoded. In combination with the value of EXPONENT 28, the event selection logic knows what bits to encode next from MANTISSA 22. Thus, to complete encoding of the error, the value 0 must be encoded. This event may take place with fixed or adaptive statistics. Assuming that the statistics are fixed at MPS of 1 and K of 1, the mantissa value of 0 is encoded as a LPS operation involving a 1-bit left shift of register C, and setting register T to 1.0. If the bucket value is 3, then two mantissa would be encoded following the fifth event as for an exponent of 3, the error range is 4, 5, 6, 7.

B. DECODING

Figure 4:
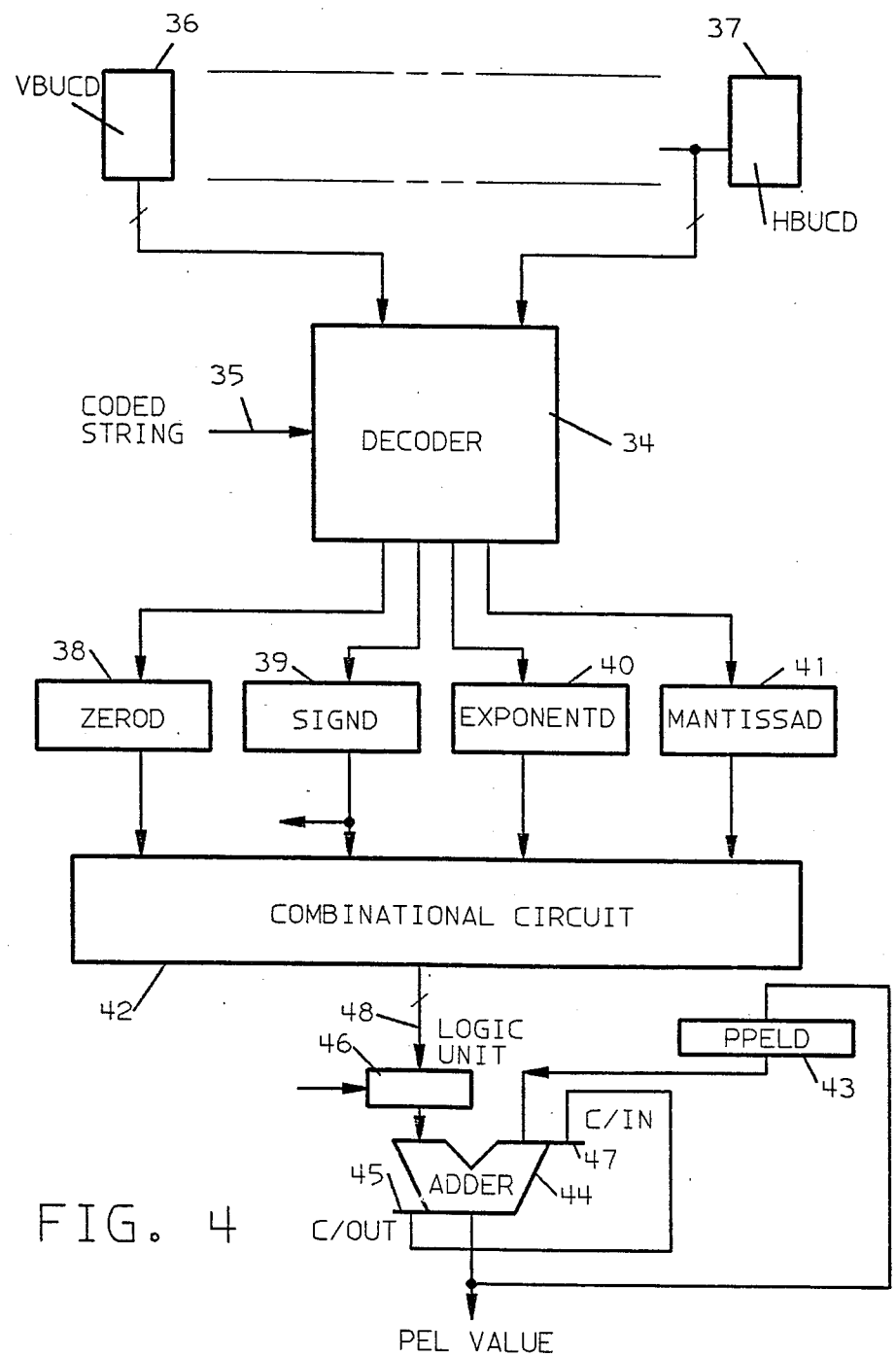
FIG. 4 illustrates the structure of the decoding unit

FIG. 4 illustrates the hardware whereby the output string of the above described encoder is decoded back into the original information. Decoder 34 receives coded string 35, vertical context components VBUCD 36 and horizontal context component HBUCD 37. It performs the decoding using the same statistics or coding parameters which were used in the encoding process and conditioned by context components HBUCD 37 and VBUCD 36.

Table 4 illustrates the steps performed by decoder 34. Using the appropriate statistics (as conditioned by context component HBUCD 37 and VBUCD 36), decoder 34 first decodes event 1 (2.2), which is an encodement of the aforementioned ZERO. The decoded result is placed in register ZEROD 38. If the prediction error is not zero (2.3), decoder 34 continues the decoding of event 2 (encodement of SIGN) and event 3 (encodement of EXPONENT) (2.4 to 2.5). The result of decoding event 2 is placed in register SIGND 39 and the result of decoding event 3 is placed in register EEXPONENTD 40. Depending on the decoded value of event 3, decoder 34 selects how many extra bits should be decoded (2.7). If the extra bits are encoded serially by bit, they are decoded in the same order and placed in an n-bit register MANTISSAD 41.

TABLE 4

| | Decoder steps |
|---|---|
| 2.1 | do until last pel |
| 2.2 | ZEROD = decode (EVENT 1) |
| 2.3 | if (ZEROD = false) then |
| 2.4 | SIGND = decode (EVENT 2) |
| 2.5 | EXPONENTD = decode (EVENT 3) |
| 2.6 | if (EXPONENTD ne 1) then |
| 2.7 | MANTISSAD = decode (EVENT 4) |
| 2.8 | endif |
| 2.9 | endif |
| 2.10 | enddo |

The contents of registers ZEROD 38, SIGND 39, EXPONENTD 40 and MANTISSAD 41 are combined in the combinational circuit 42 to form the prediction error. The logic steps of combination circuit 42 is described in Table 5.

TABLE 5

| | logic steps in the Combinational Circuit |
|---|---|
| 3.0 | Initialize prediction error to zero |
| 3.1 | If (ZEROD = true), then |
| 3.2 | prediction error = 0 |
| 3.3 | else |
| 3.4 | sign of prediction error = SIGND |
| 3.5 | if EXPONENTD = 1 then goto LAB1 |
| 3.6 | if EXPONENTD = 8 goto LAB3 |
| 3.7 | goto LAB2 |
| 3.8 | endif |
| 3.9 LAB1 | if (SIGND = +) then |
| 3.10 | prediction error = +1 |
| 3.11 | else |
| 3.12 | prediction error = −1 |
| 3.13 | endif |
| 3.14 LAB2 | I = EXPONENTD − 1 |
| 3.15 | prediction error = 1 |
| 3.16 | shift prediction error left I position |
| 3.17 | sign of prediction error = SIGND |
| 3.18 LAB3 | ORed MANTISSAD to prediction error |

If the sign of the prediction error, according to reister SIGND 39, is positive, then the output 48 of the combinational circuit 42 is passed directly through logic unit 46 and is added to the content of register PPELD 43 by adder 44 to obtain the value of the current decoded pel z(t). If the sign, according to register SIGND, is negative, then the logic unit is caused to invert output 48 of the combination circuit 42 before the addition, This effectively causes a performance of Ones Complement subtraction in case the prediction error is negative. The highest-order carry output C/OUT 45 of adder 44 is fed back to the lowest-order carry input C/IN 47 to propagate the "end-around borrow" signal.

The output of the adder 44 is saved in register PPELD 43 so that register PPELD 43 contains the pel value of the previous pel.

Although this invention has been particularly shown and described with reference to a preferred embodiment thereof, it will be understood by those skilled in the art that various changes in form and details may be made therein without departing from the spirit and scope of the invention.

I claim:

1. In the compression of multilevel signals by conditionally predicting each original signal and encoding the prediction error, said prediction error being calculated as a function of the difference between the predicted valve and the value of the signal, a method for encoding the prediction errors, comprising the step of:
   (a) assigning each prediction error to one of a plurality of predetermined error ranges, each error range being a function of the sign and the number of significant digits of the prediction error value;
   (b) assigning a probability distribution to each such error range; and
   (c) encoding a prediction error using the probability of a corresponding error range to which the prediction error is assigned.

2. A method according to claim 1 including the step of encoding the absolute value of the prediction value with its assigned error range.

3. A method according to claim 1 including the steps of assinging to an error range designated as corrresponding to a specific error value, prediction errors having a corresponding number of significant digits up to a predetermined value, and assigning to a separate error range all error values having a number of significant digits greater than said predetermined value.

4. In the compression of multilevel signals by conditionally predicting each original signal and encoding the prediction error, said prediction error being calculated as a function of the difference between the predicted value and the actual value of the signal, a method for encoding the prediction errors, comprising the steps of:
   (a) converting each prediction error into an exponent part and a mantissa part;
   (b) encoding the exponent part statistically, using a subset of prediction errors calculated from others of the plurality of multilevel signals as context; and
   (c) combining the encoded exponent part with an encoding of the mantissa part.

5. A method according to claim 4 wherein the step of converting the prediction error into an exponent part and a mantissa part is performed using a base of two.

6. In the compression of multilevel signals by conditionally predicting each original signal and encoding the prediction error, said prediction error being calculated as a function of the difference between the predicted value and the actual value of the signal, a method for encoding the prediction errors, comprising the steps of:
   (a) if the prediction error is zero, then encoding a zero; and
   (b) if the prediction error is not zero, then
      (i) encoding the sign of the prediction error;
      (ii) converting the magnitude of the prediction error into an exponent part and a mantissa part;
      (iii) encoding the exponenet part statistically, using a subset of prediction errors calculated from others of the plurality of multilevel signals as context; and
      (iv) combining the encoded exponent part with an encoding of the mantissa part.

7. In the compression of multilevel signals by conditionally predicting each original signal and encoding the prediction error, said prediction error being calculated as a function of the difference between the predicted value and the actual value of the signal, a method for encoding the prediction errors, an apparatus for encoding the prediction errors comprising:
   (a) means for converting each prediction error into an exponent part and a maintissa part;
   (b) means for storing a predetermined subset of said converted exponent parts and mantissa parts;
   (c) means for generating a context from said stored exponent parts; and
   (d) means for encoding the exponent part and the mantissa part, the exponent part being encoded statistically using said context from the context generator.

8. In the compression of multilevel signals by conditionally predicting each original signal and encoding the prediction error, said prediction error being calculated as a function of the difference between the predicted value and the actual value of the signal, a method for encoding the prediction errors, an apparatus for encoding the prediction errors comprising:
   (a) means for determining whether the prediction erorr is zero;
   (b) means coupled to said determining means and responsive to a prediction error of zero for encoding a zero; and (c) means coupled to said determining means and responsive to a prediction error other than zero for generating;
  (i) an indication of the sign of the prediction error;
  (ii) an indication of the digit position of the most significant non-zero digit of the absolute value of the prediction error;
  (iii) an indication of the absolute value of the digits following said most significant non-zero digit; and
(d) means responsive to said indications from said generator (c) for encoding a non-zero.

* * * * *